(12) United States Patent
Mergens et al.

(10) Patent No.: US 7,233,467 B2
(45) Date of Patent: Jun. 19, 2007

(54) METHOD AND APPARATUS FOR PROTECTING A GATE OXIDE USING SOURCE/BULK PUMPING

(75) Inventors: Markus Paul Josef Mergens, Revensburg (DE); Frederic Marie Dominique De Ranter, Aalter (BE); Benjamin Van Camp, Bruges (BE); Koen Gerard Maria Verhaege, Gistel (BE); Phillip Czeslaw Jozwiak, Plainsboro, NJ (US); John Armer, Middlesex, NJ (US); Bart Keppens, Gistel (BE)

(73) Assignees: Sarnoff Corporation, Princeton, NJ (US); Sarnoff Europe BVBA, Gistel (BE)

( * ) Notice: Subject to any disclaimer, the term of this patent is extended or adjusted under 35 U.S.C. 154(b) by 20 days.

(21) Appl. No.: 11/087,384

(22) Filed: Mar. 23, 2005

(65) Prior Publication Data

US 2005/0231866 A1 Oct. 20, 2005

Related U.S. Application Data

(60) Provisional application No. 60/610,905, filed on Sep. 17, 2004, provisional application No. 60/555,566, filed on Mar. 23, 2004.

(51) Int. Cl.
 H02H 9/00 (2006.01)
 H02H 3/22 (2006.01)
 H02H 1/00 (2006.01)
 H02H 1/04 (2006.01)
 H02H 9/06 (2006.01)
 H01C 7/12 (2006.01)

(52) U.S. Cl. .......................... 361/56; 361/111; 361/118
(58) Field of Classification Search .................. 361/56, 361/111, 118
 See application file for complete search history.

(56) References Cited

U.S. PATENT DOCUMENTS

| 6,617,649 | B2 * | 9/2003 | Chang et al. ................ 257/355 |
| 6,690,561 | B2 * | 2/2004 | Hung et al. .................. 361/111 |
| 2003/0151865 | A1 * | 8/2003 | Maio ........................... 361/52 |

* cited by examiner

Primary Examiner—Stephen W. Jackson
Assistant Examiner—Dharti H Patel
(74) Attorney, Agent, or Firm—Lowenstein Sandler PC

(57) ABSTRACT

A method and apparatus for providing ESD event protection for a circuit using a source or bulk pump to increase the bulk and/or source potential level during an ESD event. The apparatus comprises a protection circuit that, in response to an ESD event, limits the voltage formed between two terminals of a transistor by adjusting a potential level on the second terminal.

24 Claims, 7 Drawing Sheets

METHOD AND APPARATUS FOR PROTECTING A GATE OXIDE USING SOURCE/BULK PUMPING

CROSS-REFERENCE TO RELATED APPLICATIONS

This application claims benefit of U.S. provisional patent applications Ser. No. 60/555,566, filed Mar. 23, 2004, and Ser. No. 60/610,905, filed Sep. 17, 2004, both are herein incorporated by reference.

BACKGROUND OF THE INVENTION

1. Field of the Invention

The present invention generally relates to circuits that provide electrostatic discharge protection, and more particularly, to a method and apparatus for protecting a gate oxide using source/bulk pumping.

2. Description of the Background Art

The protection of an ultra-thin gate oxide against electrostatic discharge (ESD) stress is a critical factor in obtaining sufficiently high levels of ESD hardness in advanced CMOS technologies. When the voltage applied to a gate oxide becomes too high, the gate oxide will suffer from catastrophic damage, i.e., it will break down. Typically, $SiO_2$ breaks down at electric field strengths of 6-9 MV/cm (DC). During ESD stress, the pulse duration is typically on the order of 100 ns, allowing significantly higher voltage across the oxide before damage occurs, i.e., the maximum field that causes breakdown may be about 20 MV/cm. Conventional ESD protection circuits, e.g., ESD clamps, work well at protecting standard, circuits.

When a gate oxide is about or thinner than 5 nm, an ESD event causes a quantum-mechanical tunneling effect and electrons will pass through the oxide creating a tunneling current. Such a tunneling current leads to excessive power dissipation. The gate oxide very quickly suffers overheating and is irreversibly damaged. Damage can occur in the following regions of the gate oxide: directly between the gate electrode and the substrate (bulk) and/or between the gate facing either the source or the drain region. In typical dual-well CMOS technologies (where the P-well is not isolated from the substrate), the gate-to-bulk oxide breakdown occurs at significantly higher voltage levels as compared to the gate-to-source/drain breakdown. For example, an ultra-thin gate oxide has been found to have a gate-to-source breakdown voltage, BVox(G-S), of approximately 5V. On the other hand, the gate-to-bulk breakdown voltage, BVox(G-B), for the same device, occurs at a higher voltage, e.g., greater than 10V. Consequently, to protect an ultra-thin gate oxide designers have predominantly focused on limiting the more critical gate-to-source ESD voltage.

FIG. 1 depicts a graph 100 of an example of a transient breakdown characteristic for a transistor with a gate oxide thickness of 2.2 nm. As depicted in plot 102 of gate current versus applied gate-to-source voltage, excessive tunneling current begins at around 6V and damage occurs at around 7V. Overlaid, to form a so-called "ESD Design Window", is a plot 104 of the I-V characteristic of a prior art ESD protection clamp (e.g., GGNMOS). A comparison of the I-V characteristic of the ESD protection device (plot 104) with the breakdown characteristic of the ultra-thin gate oxide (plot 102) demonstrates that the voltage across the clamp quickly exceeds the tunneling voltage and the breakdown voltage of the oxide. Thus, the capability of the protection device (i.e., to clamp the ESD voltage transient) is rather limited. Consequently, the use of a traditional ESD protection device with ultra-thin gate oxide devices has limited effectiveness in protecting the devices from gate damage from ESD events.

Technology downscaling forces the oxide thickness to decrease further and further, while the I-V characteristics for clamping devices do not scale down at the same pace because of certain physical limitations to scaling the protection circuits. As the continued reduction of oxide thickness further reduces the breakdown voltage to lower and lower values, the ESD protection device cannot effectively protect the oxide by clamping the voltage. As depicted in FIG. 1, the ineffectiveness becomes obvious in a reduced maximum ESD stress handling current Imax (in contrast to the actual limit of the clamp as determined by its second breakdown trigger current It2). As such, the value of using conventional ESD protection devices with ultra-thin gate oxide devices is limited.

Therefore, there is a need in the art for a method and apparatus for protecting ultra-thin gate oxides from damage during an ESD event.

SUMMARY OF THE INVENTION

The present invention is a method and apparatus for limiting the gate-to-source and/or gate-to-bulk voltage by pumping either the bulk and/or source in response to an ESD event. The apparatus comprises a protection circuit that, in response to an ESD event, limits the voltage formed between two terminals of a transistor by adjusting a potential level on the second terminal. In one embodiment of the invention, an electrical signal resulting from an ESD event is coupled from a transistor gate terminal experiencing the event to an impedance circuit connected to the source and/or bulk of the transistor. The voltage produced across the impedance circuit raises the potential level of the source and/or bulk, thus limiting the gate-to-source and/or gate-to-bulk voltage produced by the ESD event.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Instead of solely focusing on the optimization of effective ESD clamps (fast, low resistance) to limit the voltage at the gate node, the present invention makes use of a novel concept: by increasing the source potential of the endangered transistor during ESD stress conditions, the ESD voltage across the endangered gate-source oxide is reduced. Note, that the same mechanism can be applied to the bulk semiconductor material in which the transistor is formed as long as the bulk of the transistor is isolated (NMOS: isolated P-well in triple-well technology, PMOS: isolated N-well). The result of raising the source or bulk potential is that a higher transient gate bias can be tolerated before the oxide breakdown limit is reached. This source bias technique effectively expands the ESD design window and relaxes the ESD protection challenge for ultra-thin gate oxides.

Figure 1:
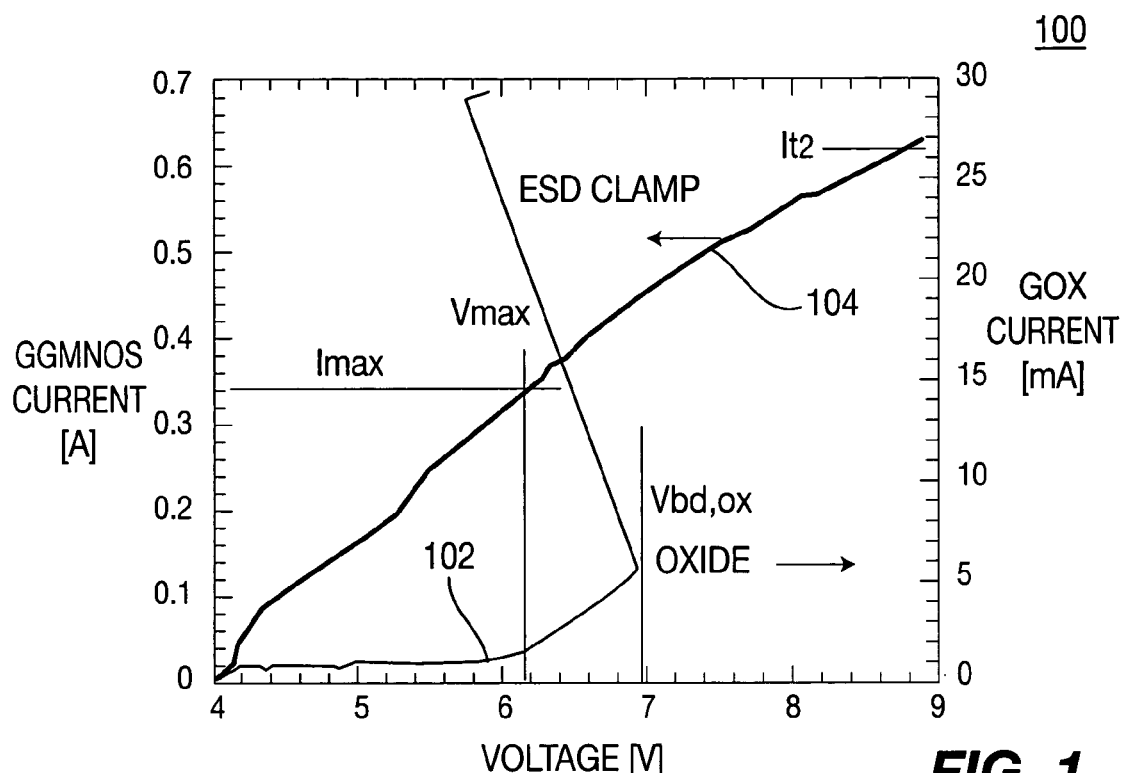
FIG. 1 depicts a graph comparing a plot of the I-V characteristics of a conventional ESD clamp circuit to the I-V characteristics of an ultra-thin oxide gate.
Figure 2:
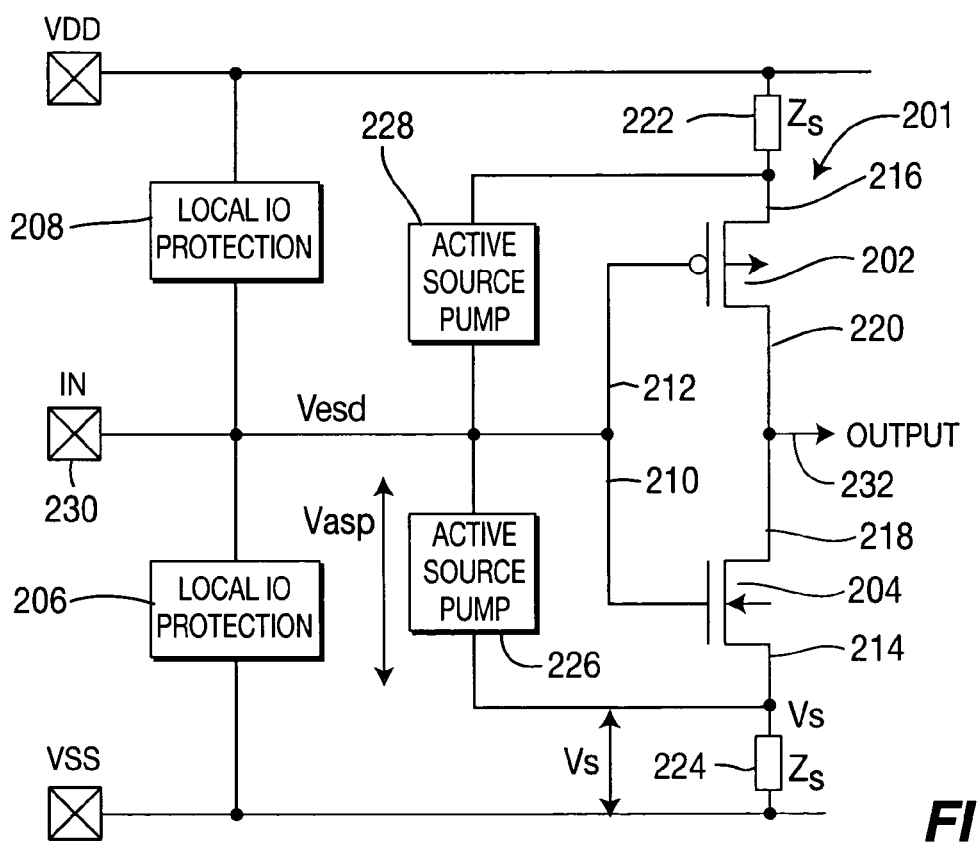
FIG. 2 depicts a simplified block diagram of a first embodiment of an ESD protection circuit in accordance with the present invention.

FIG. 2 depicts a block diagram of a first embodiment of a circuit 200 that performs source pumping in accordance with the present invention. The circuitry 201 to be protected from ESD events comprises transistors 202 and 204, e.g., a traditional input signal inverter. These transistors may be NMOS or PMOS type transistors. Of course, the present invention can be used with other circuit configurations, devices or individual transistors.

A first conventional ESD clamp circuit 206 (also referred to herein as a primary protection circuit) is formed between the IN terminal and Vss, and a second conventional ESD clamp circuit 208 is formed between the IN terminal and Vdd. For example, such circuits include those described in commonly assigned U.S. Pat. Nos. 6,768,616 and 6,791,122 which are herein incorporated by reference. Each transistor 202 and 204 comprises a gate 212/210, a source 216/214, and a drain 220/218. Vdd is coupled to the source 214 of transistor 202 via a first source impedance circuit 222. The gates 210/212 of the transistors 202 and 204 are connected together and to the IN terminal 230 (e.g., a pad of an integrated circuit). The drains 218/220 are also connected together and form the OUTPUT terminal 232 of the circuit 200. The source 216 of transistor 204 is coupled to Vss via a second source impedance circuit 224. An active source pump (ASP) 226 is coupled from the gate 210 to the source 214 of transistor 204 and similarly an active source pump (ASP) 228 is coupled from the gate 212 to the source 216 of transistor 202.

Figure 3:
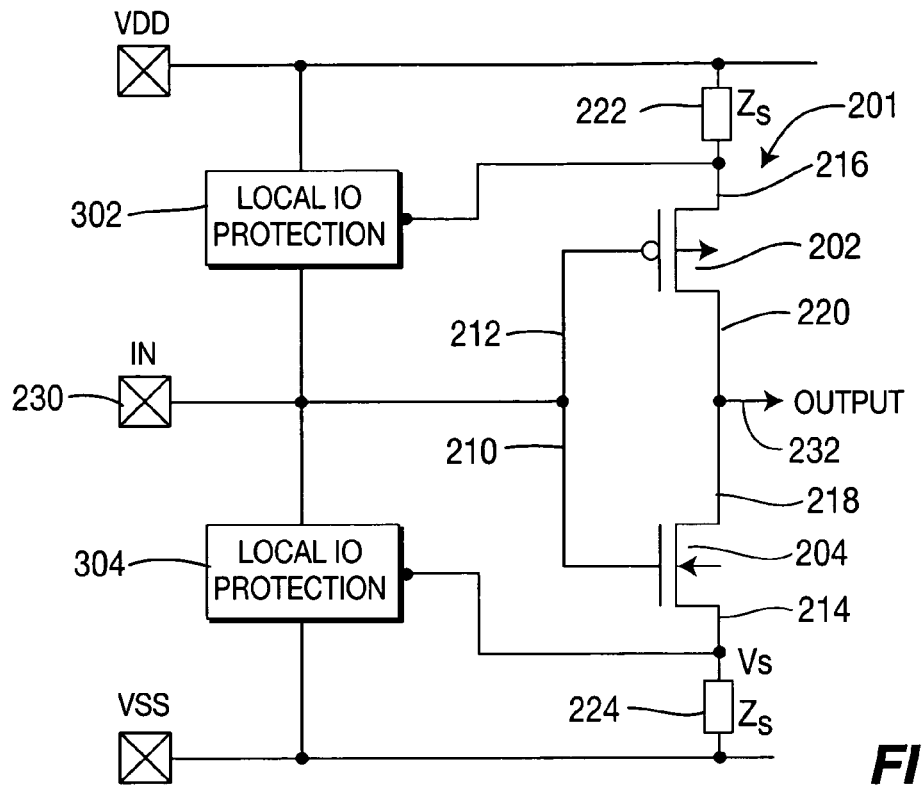
FIG. 3 depicts a simplified block diagram of a second embodiment of an ESD protection circuit in accordance with the present invention.

FIG. 3 depicts a block diagram of a circuit 300 that forms a second embodiment of the invention, wherein the source pumping voltage is supplied by each of the primary protection circuits 302 and 304. In other words, the source pumps 226 and 228 of FIG. 2 are embedded into the ESD clamp circuits 302 and 304.

Figure 11:
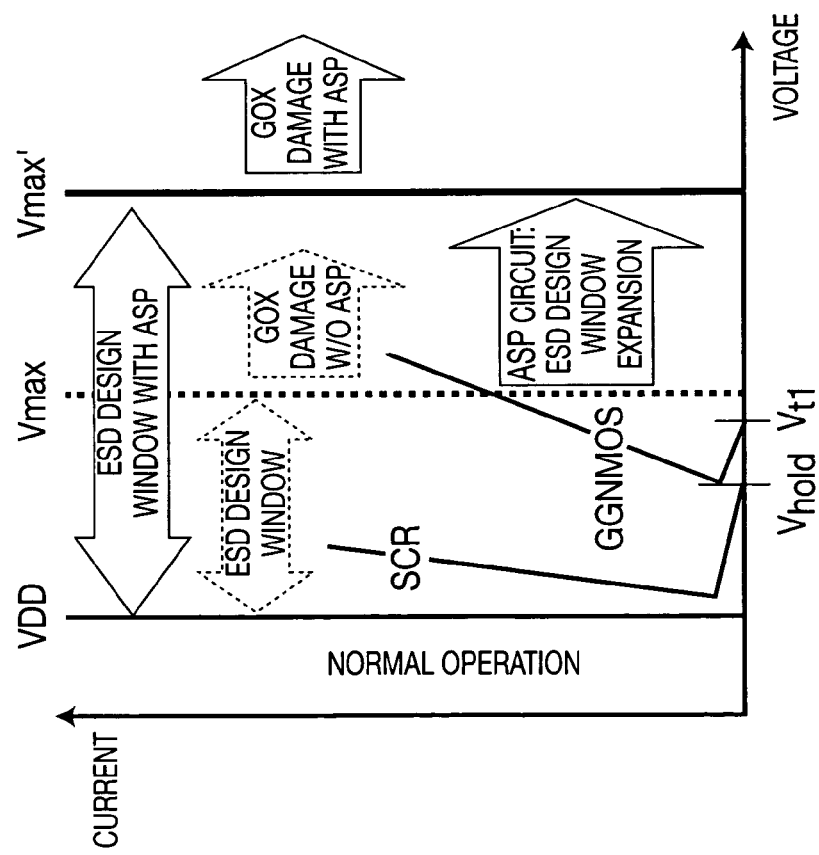
FIG. 11 depicts a graphical visualization of the ESD window expansion that is provided by the invention.

In either embodiment, during an ESD stress event, the source impedance circuits 222/224 provide a voltage drop to lift the source potential by pumping a small amount of ESD current (typically <100 mA) into the internal source nodes 214/216. A small fraction of the ESD current is conducted thru the source impedance $Z_S$ 222/224 that, in turn, results in a source bias voltage $V_S$. In other words, the total ESD voltage occurring between pad and ground is divided into two parts: $V_{ESD}=V_{ASP}+V_S$. As a result, a higher total transient gate voltage $V_{ESD}$=Vmax' can be tolerated before the low ESD voltage limit Vmax (close to the transient oxide breakdown) directly across the gate oxide (GOX) is reached. In other words, the effective ESD design window is expanded as graphically visualized in FIG. 11.

During normal operation, the ASP 226/228 is deactivated, such that $V_S$~0V and (almost) the entire voltage drops across the ASP 226/228 at acceptably low leakage currents. In order to prevent a detrimental impact of the source impedance on normal operation, it is beneficial to design the source impedance to have the lowest possible impedance. However, there is a trade-off with ESD, which benefits from a large impedance value.

The source impedance circuits 222/224 may comprise at least one of a resistance, a capacitance, an inductance, or a combination of thereof. In one implementation the invention, the source impedances 222/224 are ohmic reistances $R_S$ (i.e., real impedance). The implementation described below with respect to FIG. 14 includes a complex impedance. To bias the source during an ESD event using source resistors, the source resistors, Rs, 223 and 225 need to be formed in the inverter MOS transistors as either a real passive resistor element (e.g., silicide-blocked source junction diffusion, separate diffusion or poly resistor) or by an active element (e.g., a series MOS transistor that is in a low-resistive state during normal operation and high-resistive during an ESD event). Such a transistor for instance, may already be present in a cascoded input stage (e.g., LVDS) or the transistor can be introduced into the circuitry for ESD protection purposes as long as the addition of the transistor does not impact the normal operation of the circuit 201.

The maximum permissible resistance Rs of a source-series resistors 223/225 in NMOS/PMOS inverter circuit 201 depends on the specific IC application and normal operation specifications. During normal operation, the source resistor 223/225 would reduce the effective gate-source bias to $V_{GS}^{eff}$=Vin−Rs×$I_{DS}$ and thus the input stage performance. For example, in a typically 10 um-wide NMOS input circuit with a rough MOS performance of 0.5 mA/um, a source resistance of Rs=25 Ω would lead to a de-biasing effect of roughly Rs×$I_{DS}$~25 Ω×5 mA=125 mV and thus to a reduction of the effective gate-to-source bias $V_{GS}^{eff}$=Vin−125 mV. Hence, for typically low input voltage of Vin<1.5V in ultra-thin gate oxide input applications, the addition of source resistors 223/225 would mean an approximately 10% gate-bias decrease. The related performance drop can be, for instance, compensated by a slightly increased transistor width.

In this first embodiment of the invention, a "source pump" can be realized following two different concepts using the source "resistor" element. The first concept uses a dedicated source pump 226/228 arranged in parallel with the primary protection circuits 206/208 (to clamp the transient ESD voltage between IN and Vss). In this implementation, the pump triggers into a current conduction mode (for worstcase stress) at a sufficiently low ESD voltage, thus lifting the source potential due to a voltage drop across Rs (FIG. 2). Alternatively, the primary protection clamp 302/304 can be used to derive an electrical signal as soon as triggered by an ESD event (FIG. 3) to drive the source resistors 223/225 and create a source pump effect. Both techniques operate with NMOS and PMOS transistor circuits. Note that the different critical stress cases must be distinguished for different pins, which are often represented by positive ESD on IN vs. VSS for the NMOS and positive ESD on VDD vs. IN for the PMOS, respectively. The design of the source pumps needs to ensure that the source biasing mechanism is activated for these stress events.

One advantage of the dedicated pump technique of FIG. 2 is that the pump mechanism that expands the ESD design window for the ultra-thin gate oxide can be activated independently from the protection clamp. This immediate effect can efficiently counteract trigger issues in the protection device 206/208 related to a slow response time of the clamping process, which often results in transient voltage overshoots endangering ultra-thin gate oxides.

Figure 4:
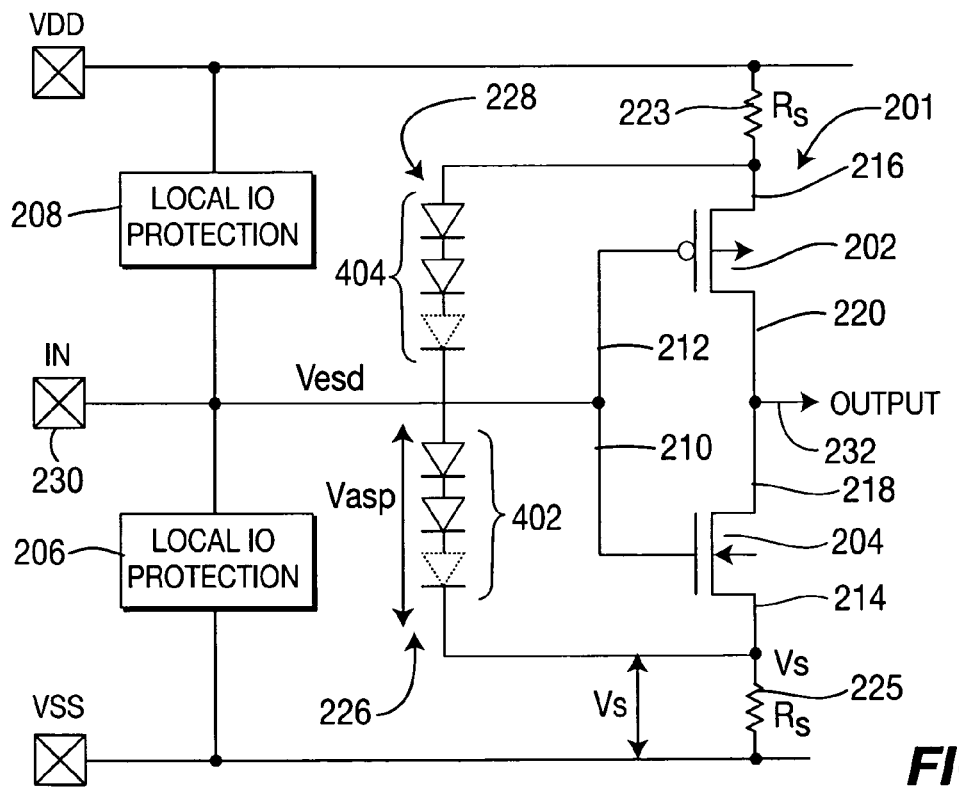
FIG. 4 depicts a detailed schematic diagram of a first implementation of the first embodiment of FIG. 2.

FIG. 4 depicts a schematic of a circuit 400 forming a first implementation of the first embodiment of the invention of FIG. 2. The circuit 400 comprises a dedicated source pump circuit 226/228. One implementation of such a dedicated source pump circuit 226/228 is a diode chain 402/404 in series with a passive source resistor 223/225. Other pump configurations employing, for example, a PMOS detector circuit are possible as well.

The number of series diodes 402/404 required in the pump circuit 226/228 is determined by normal operation specifications of the circuit 400 such as the input signal swing and input leakage. If, for example, the maximum input voltage during normal operation corresponds to Vin=1V, three diodes are needed to sufficiently limit normal operation leakage allowing a voltage drop of 0.33V per diode. As a rule of thumb, the maximum permissible voltage drop per diode is roughly defined as 0.4 volts. This value results in a minimum number of n=Vin/0.4V diodes.

During ESD stress conditions, the diode chain provides a high enough current, up to approximately Ip~100 mA, to produce a substantial voltage drop across the source resistor Rs 223/225 that have a value of about 10 to 50 Ohm. For an ultra-thin gate oxide with a transient gate-source oxide breakdown of about BVox(GS)~5V, the ESD design window is increased by approximately Ip×Rs ~1 to 5V (up to 100%). The diode width must be established such that the diodes can inject enough current into the source to provide the pumping effect, while restricting the ESD voltage drop across the diode chain pump. This voltage drop is directly exposed to the sensitive gate-source oxide and, therefore, must not exceed the transient oxide breakdown value. Note that the diodes can be designed fairly small in width with a reasonably low series resistance due to the relatively small pump current that is required to achieve the source pumping effect.

Figure 5:
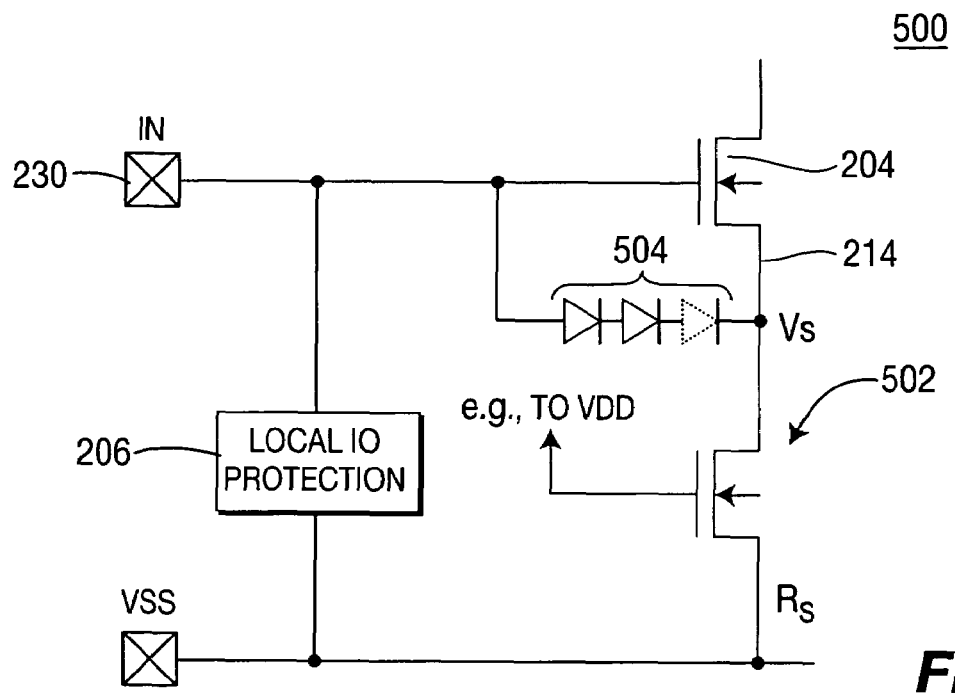
FIG. 5 depicts a detailed schematic diagram of a second implementation of the first embodiment of FIG. 2.

FIG. 5 depicts a schematic diagram of a second implementation of the first embodiment of the invention of FIG. 2. Specifically, FIG. 5 depicts an NMOS portion 500 of a cascode circuit design comprising a lower NMOS transistor 502 as a source impedance 224 in conjunction with a diode-chain pump 504. The combination of the pump 504 and the transistor 502 increases the source potential of the upper NMOS transistor 204 where the endangered gate oxide is exposed to the input pad 230. Such a cascode configuration is present in various input pads (e.g., LVDS) or can be introduced into the circuit for ESD protection purposes, as long as the additional circuitry does not interfere with normal operation of the circuit 201.

In the case of $Z_S=R_S$ in any of the embodiments discussed above, the ASP on-resistance $R_{ASP}$ and the source resistor $R_S$ act as a voltage divider. This results in an analytical expression for the increased ESD design margin Vmax'

$$V\text{max}'=(1+R_S/R_{ASP})\cdot V\text{max}$$

Assuming an ASP design with $R_S=R_{ASP}$, a 100% increase of the ESD design window, i.e. Vmax'=2·Vmax can be achieved.

Figure 12:
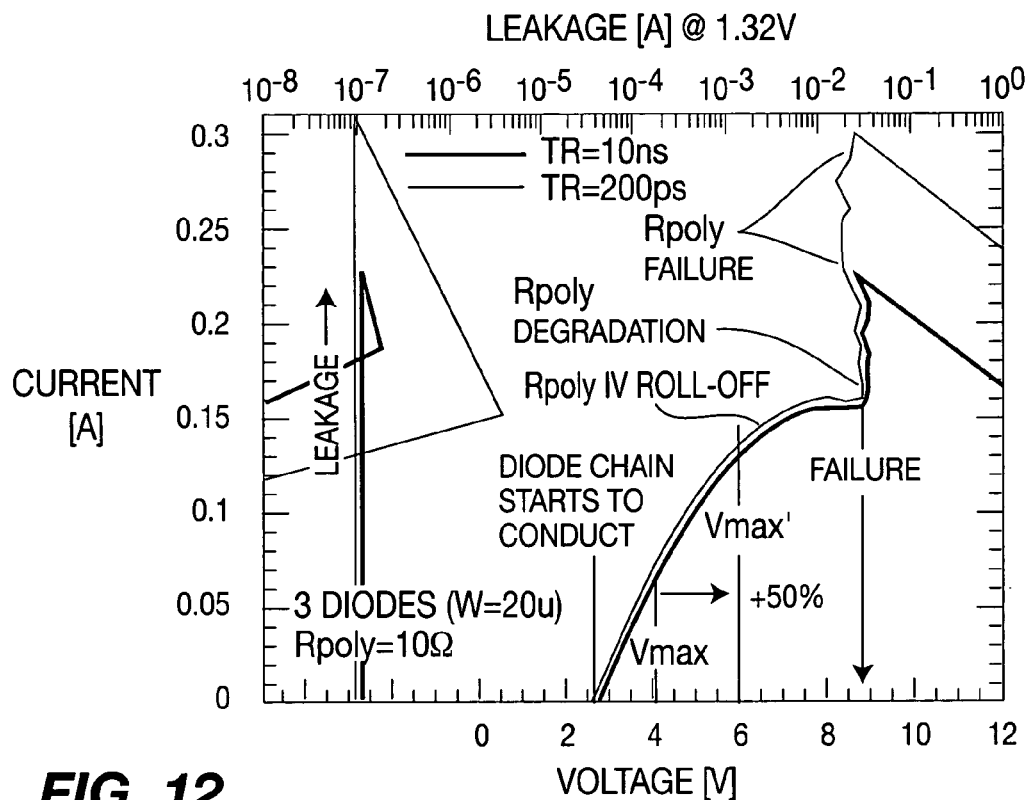
FIG. 12 depicts the TLP analysis results for a circuit using a 10 Ω source resistor.
Figure 13:
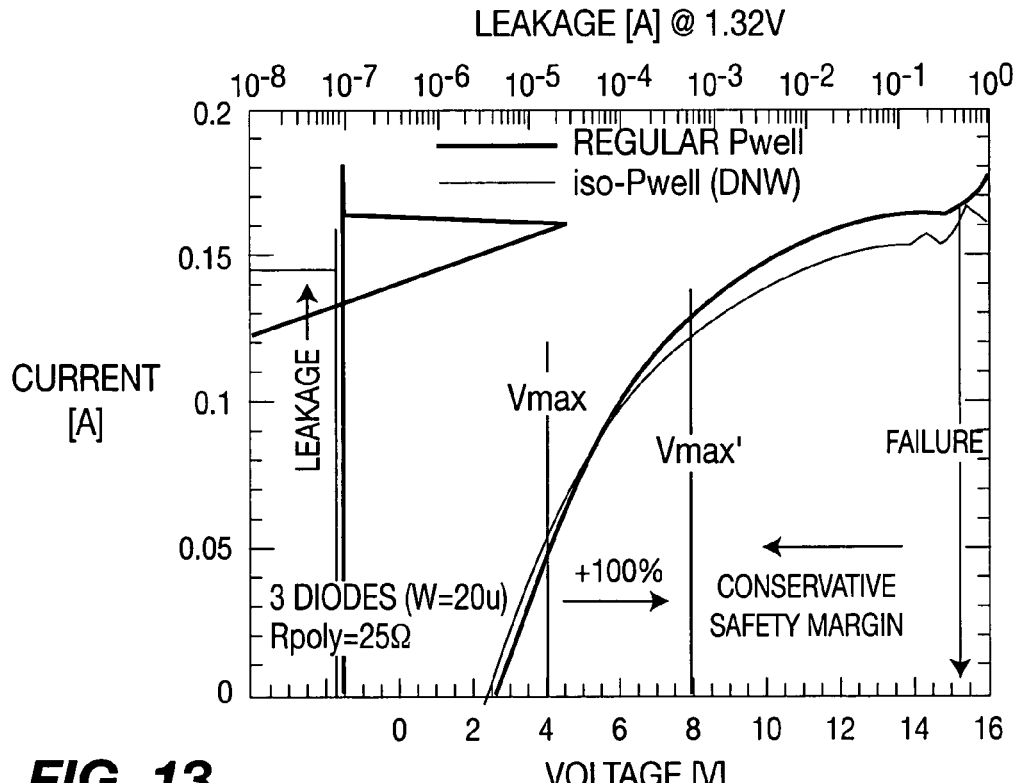
FIG. 13 depicts the TLP analysis results for a circuit using a 25 Ω source resistor.

FIGS. 12 and 13 depict the transmission line pulse (TLP) analysis results (positive pulse polarity for IN vs. GND) for the circuit structure of FIG. 4 containing a source resistor of $R_S=10\ \Omega$ (FIG. 12) and $R_S=25\ \Omega$ (FIG. 13) in regular Pwell/isolated Pwell (DNW). Obviously for voltages below approximately 3V, no significant amount of current can flow thru the diode chain in series with $R_S$. At higher ESD voltage, the diodes start to conduct resulting in a pumping of the source/drain node and thus in a reduced $V_{GS}/V_{GD}$. At elevated currents, the linear I-V curve regime bends into an I-V roll-off that is a characteristic of poly resistors under high current conditions. In case of $R_S=10\ \Omega$ (FIG. 12), the upper ESD design margin limit can be increased to approximately Vmax'=6V as indicated by a constant leakage current evolution up to the point where the poly resistor fails as shown by a rapid leakage drop and voltage increase. The initial leakage current increase before poly fails could indicate that the gate oxide is damaged first. These results correspond to an at least 50% increase of the original most critical ESD design margin Vmax=4V (close to oxide breakdown). The measurement results were verified for slow (TR=10 ns) and fast TLP rise times (TR=200 ps), respectively, hence ensuring that ASP reacts fast enough also for very fast ESD transients such as CDM. FIG. 13 reveals a Vmax'=8V for Rs=25 Ω, which is equivalent to a 100% increase of the critical ESD design limit Vmax. In addition to the regular P-well NMOS, also a structure variation containing an isolated P-well connected to Rs was investigated. The same ESD design increase can be achieved. Note that in both cases discussed above, a very conservative safety margin definition for the extracted Vmax' was considered concerning the damage level.

Figure 6:
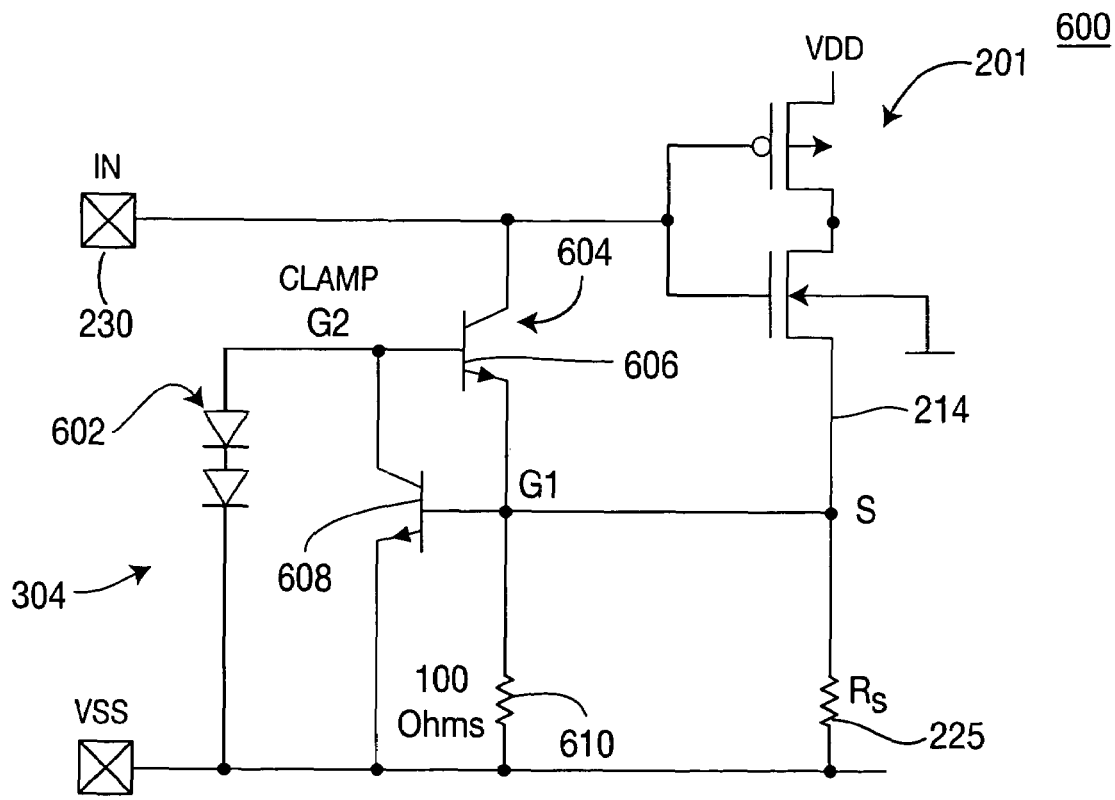
FIG. 6 depicts a detailed schematic diagram of a first implementation of the second embodiment of FIG. 3.

FIG. 6 depicts a schematic diagram of a first implementation of the second embodiment of the invention of FIG. 3. In this embodiment, the primary protection device 304 is coupled between the input pad 230 and Vss (e.g., ground) and provides the pump current for the source resistor 225. In the implementation shown in FIG. 6, the protection circuit is a diode triggered SCR (DTSCR) comprising trigger diodes 602 and an SCR 604. The SCR 604 comprises a pair of transistors 606 and 608 and a resistor 610 arranged in a conventional manner to clamp the gate voltage to a level below the breakdown voltage of the gate oxide. Such a DTSCR is disclosed in commonly assigned U.S. Pat. No. 6,768,616, issued Jul. 27, 2004. As soon as the DTSCR 304 is latched during an ESD event, a potential is internally generated within the P-well and N-well of the SCR 604. For a G2-triggered element (diode trigger chain connected to G2 N-well), this potential can be tapped into by using the SCR gate G1. When this potential is applied to the internal source 214 of the endangered NMOS transistor 204, a significant reduction of the effective gate/source potential is achieved.

Figure 7:
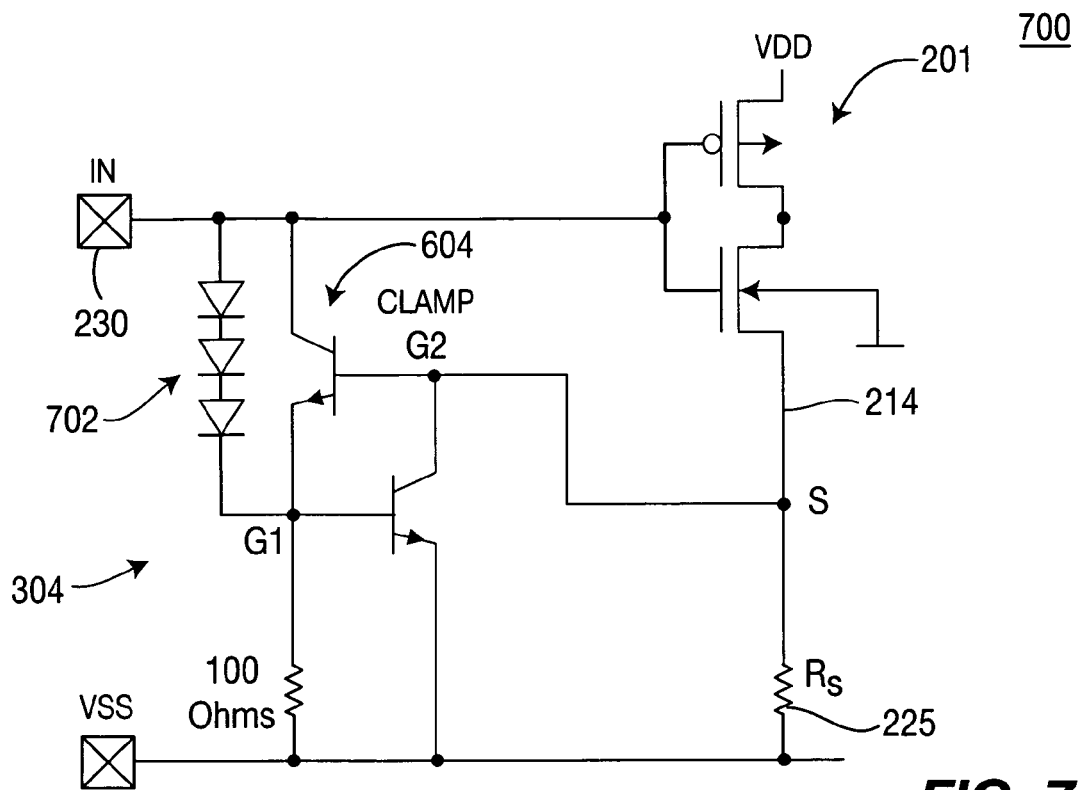
FIG. 7 depicts a detailed schematic diagram of a second implementation of the second embodiment of FIG. 3.

FIG. 7 depicts a schematic diagram of a second implementation of the second embodiment of the invention of FIG. 3. In this embodiment, the DTSCR 604 is triggered through G1 by a diode chain 702 coupled to the input pad

230. In this case, the source pump signal comes from the "isolated" N-well (i.e., the SCR G2). The potential generated in the N-well roughly corresponds to half of the total voltage drop across the SCR during an ESD event. When this voltage is applied to the internal source 214 of the endangered NMOS transistor 204, a significant reduction of the effective gate/source potential is achieved.

Other source pump configurations are possible as well. For example, applying NMOS-type ESD circuitry as primary protection in conjunction with a source resistor in the ESD current path. This source resistor of the NMOS protection provides the voltage drop during an ESD event (Rs×Iesd), which can be applied to the internal source 214 of the MOS input stage reducing the effective gate-source voltage.

Figure 8:
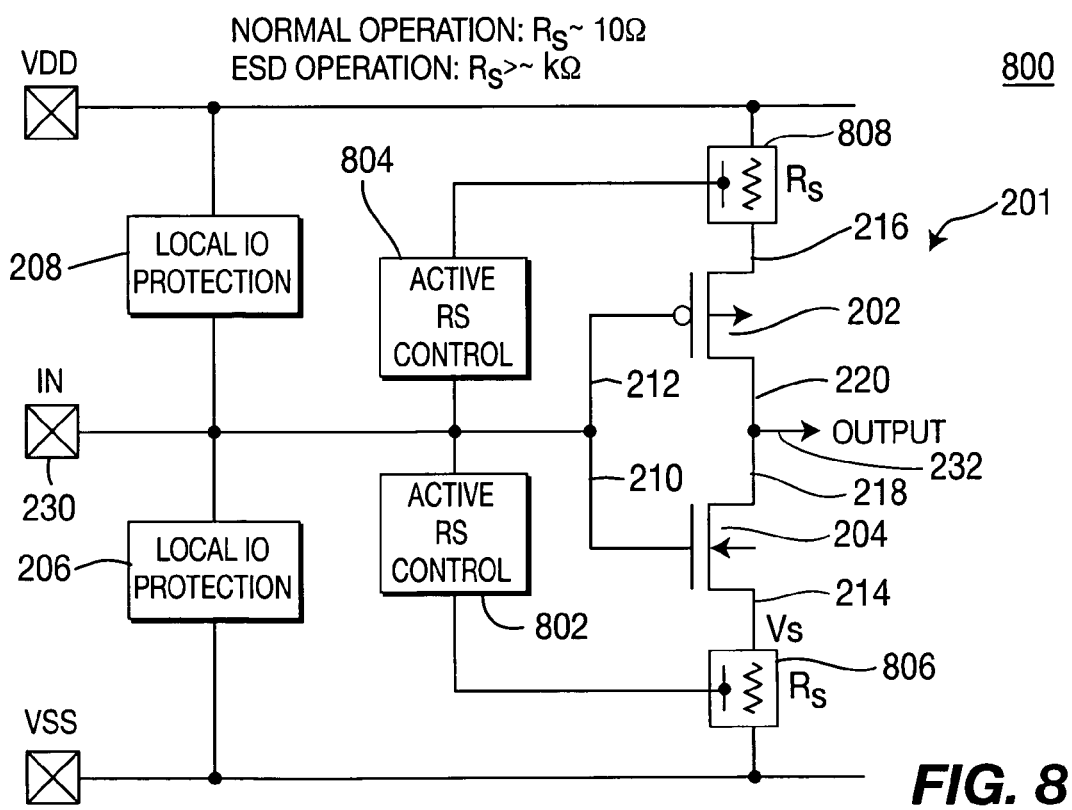
FIG. 8 depicts a block diagram of a third embodiment of the invention.

FIG. 8 depicts a block diagram of a third embodiment of the invention. The general concept of this embodiment is to create a potential increase at the internal source node due to the tunneling current flowing through the gate-source oxide during ESD without using any external pump current. Prerequisite for a functional design, however, is that the source series resistance 806/808 can be switched from a relatively low-ohmic normal operation state (Rs~10 Ω) to high-ohmic ESD value (Rs>~kΩ). Suitable Rs elements 806/808 as well as control circuits 802/804 are required. The control circuits 802/804 detect the ESD event and turn the active Rs device 806/808 into the high-resistance ESD mode, thus increasing the internal source voltage and allowing for a higher ESD gate voltage Vg.

Figure 9:
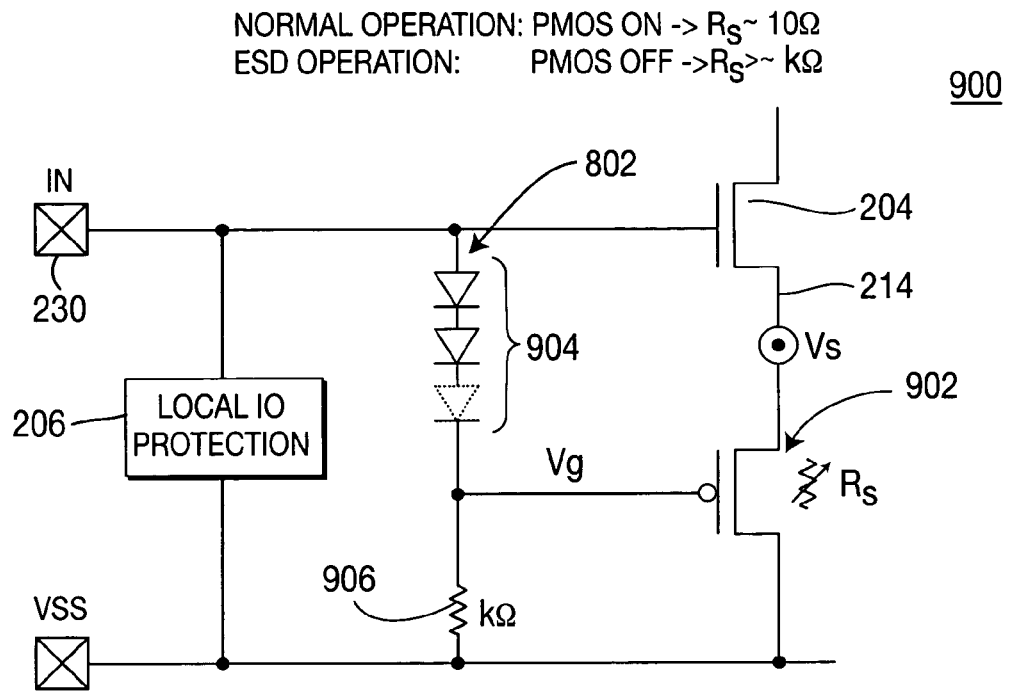
FIG. 9 depicts a schematic diagram of a first implementation of the third embodiment of FIG. 8.

FIG. 9 depicts a first implementation of the third embodiment of the invention shown in FIG. 8. A normally-on PMOS transistor 902 is connected in series with the NMOS input transistor 204. A control circuit 802 comprising a series connected diode chain 904 and resistor 906 that serve as an ESD event detector. The control circuit 802 is coupled between the input pad 230 and Vss. The junction between the diode chain 904 and the resistor 906 is coupled to the gate of transistor 902 such that the control circuit 802 deactivates the PMOS transistor 902 during ESD stress conditions. The internal source bias (corresponding to increase of ESD design window) basically follows the PMOS transistor gate voltage: Vs~Vg+Vth(PMOS). This technique is however only applicable for special analog circuits due to the Vth voltage drop across the PMOS transistor during normal operation.

Figure 10:
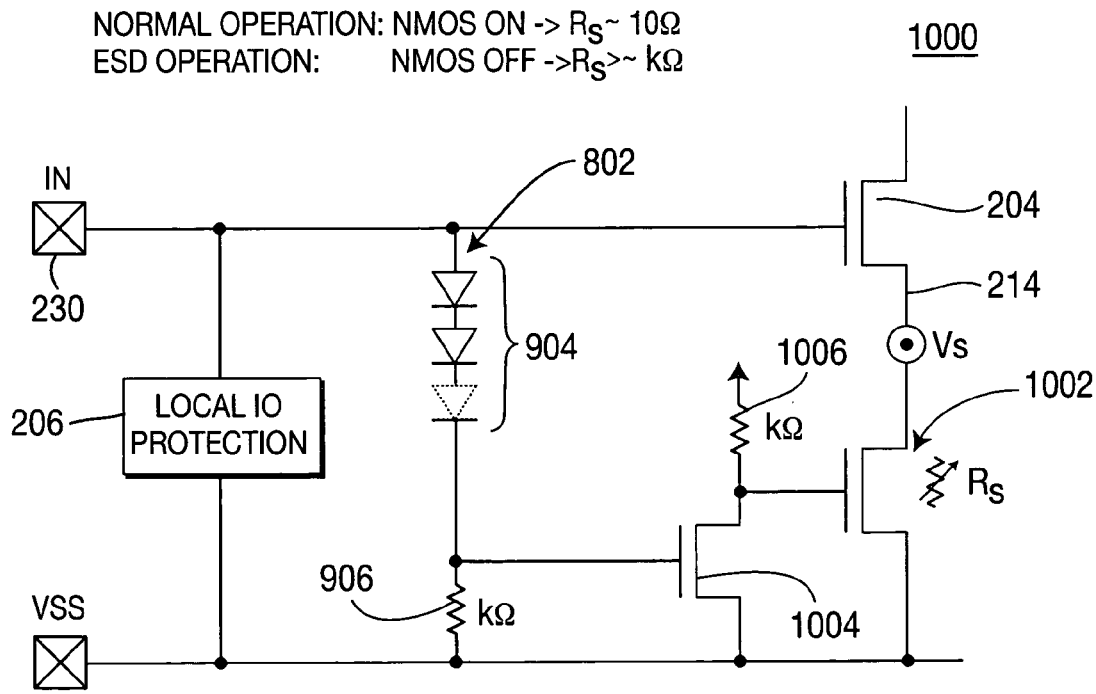
FIG. 10 depicts a schematic diagram of a second implementation of the third embodiment of FIG. 8.

The circuit 1000 of FIG. 10 represents a second implementation of the third embodiment of the invention of FIG. 8. The circuit 1000 employs an NMOS series transistor 1002 (often present already) instead of a PMOS transistor 902. This circuit 1000 does not show this disadvantage and is therefore more universally applicable. Under normal operating conditions, the diode string 904 does not conduct current. Consequently, the gate of transistor 1004 is low and the transistor is not conducting. The resistor 1006 couples VDD to the transistor 1004. Since transistor 1004 is not conducting, the gate of transistor 1002 is high, which causes transistor 1002 to be in a low ohmic state, i.e., couples the source 214 to Vss through a low ohmic path.

Upon the occurrence of an ESD event, the voltage at the input node 230 will cause the diode string 904 to start to conduct and causes current to flow through resistor 906. The voltage across resistor 906 pulls the gate of transistor 1004 to a high state, which activates the transistor 1004. When transistor 1004 conducts, it will pull the gate of transistor 1002 to a low state. The transistor 1002 switches into a high ohmic state, which raises the potential on the source 214.

In case of an isolated P-well technology (e.g., triple-well with a deep N-well or silicon-on-insulator (SOI)), the same techniques presented above can be used to pump the bulk to higher potentials during ESD stress. Thus, the effective gate-bulk breakdown voltage can be increased simultaneously to the gate-source breakdown voltage. This is in particular beneficial if the oxide breakdown behavior does not follow the trend BVox(GB)>BVox(GS). To perform bulk pumping, an impedance circuit is connected between the bulk of the transistor and ground and a pumping circuit is connected between the pad and the impedance. By shunting an electrical signal from the pad due to the ESD event to the impedance, a potential is created across the impedance circuit to decrease the gate-to-bulk voltage that would be produced by the ESD event when an bulk impedance circuit is not used. The impedance circuit may be a combination of one or more of resistor, capacitor or inductor. The bulk pump may be used without a source pump; however, they are best used in combination.

Figure 14:
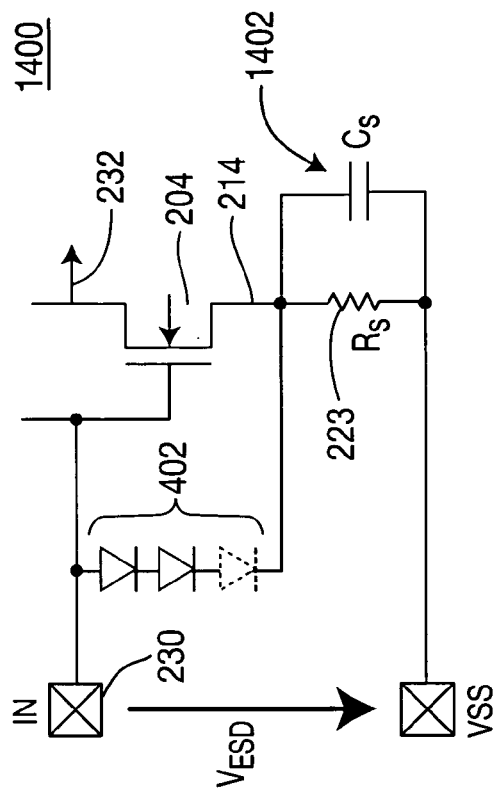
FIG. 14 depicts another embodiment of the invention that uses a complex source impedance.

In any of the foregoing embodiments, the source impedance circuit 222/224 may be a complex impedance. FIG. 14 depicts a block diagram of a circuit 1400 having a source capacitor $C_S$ 1402 in parallel to the source resistor $R_S$ 223. The purpose of capacitor $C_S$ is to shunt RF noise naturally introduced by a resistor to ground. Such a noise source can increase the noise figure of the circuit and degrade the performance of low-noise RF applications (e.g. LNA).

Example calculation for $C_S$=2.5 pF with resulting impedance of $1/(\omega_{ESD} \cdot C_S)$ for typical ESD frequencies in the human body model (HBM) and fast charged device model (CDM) stress case:

HBM (duration T~100 ns): $Z_S$~8 KΩ

CDM (duration T~1 ns): $Z_S$~80 Ω

The parallel capacitor maintains a sufficiently high impedance during even fast CDM stress frequencies such that a functional ASP voltage accumulation can be ensured.

Another embodiment using a complex impedance $Z_S$ may utilize an inductor, which is sometimes already present within RF circuits for on-chip matching purpose.

Figure 15:
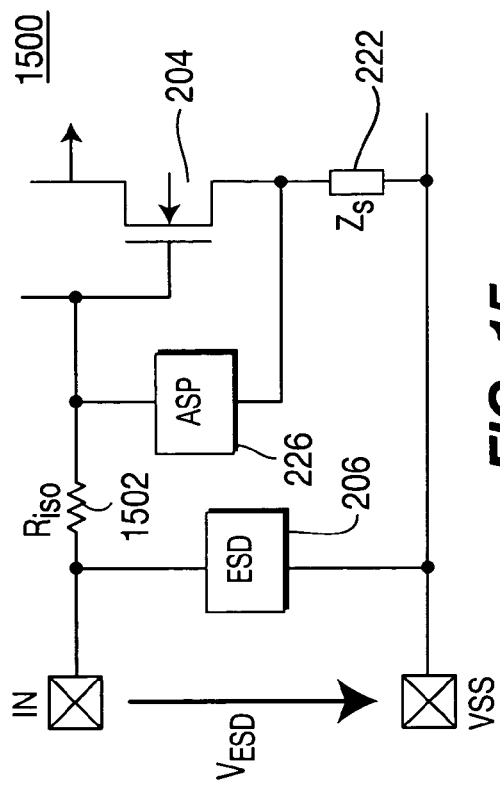
FIG. 15 depicts another embodiment of the invention that uses an isolation resistor in the input path.

Another embodiment of the invention depicted as circuit 1500 in FIG. 15 combines the ASP circuit technique of FIG. 2 with a pi-type clamp concept using an isolation resistor 1502 between the pad 230 (primary protection 206/208) and secondary protection device (ASP 226/228). Here, the ASP technique also serves as a secondary clamp. The additional voltage drop across Riso 1502 will further relax the ESD design window.

While the foregoing is directed to embodiments of the present invention, other and further embodiments of the invention may be devised without departing from the basic scope thereof, and the scope thereof is determined by the claims that follow.

What is claimed is:

1. An electrostatic discharge (ESD) protection circuit for protecting a transistor having at least a first terminal, a second terminal and a third terminal comprising:

a protection circuit, coupled from the first terminal to the second terminal, for limiting a voltage to protect circuitry between the first terminal and the second terminal by adjusting the potential level of the second terminal in response to an ESD event being incident upon the first terminal, wherein said protection circuit comprises a pump circuit and an impedance circuit, said impedance circuit coupled from the second terminal to a first potential, where said pump circuit applies an electrical signal to the impedance circuit in response to an ESD event being incident upon the first terminal; and a second potential connected to the first terminal of the transistor; wherein said second potential is external to the circuit.

2. The ESD protection circuit of claim 1 further comprising:
a primary protection circuit coupled from the first terminal of the transistor to a first potential.

3. The ESD protection circuit of claim 1 wherein the impedance circuit comprises at least one of a resistance, a capacitance, and an inductance.

4. The ESD protection circuit of claim 1 wherein the impedance circuit comprises a resistor connected in parallel with at least one of a capacitor and an inductor.

5. The ESD protection circuit of claim 1 wherein the impedance circuit comprises at least one active device.

6. The ESD protection circuit of claim 1 wherein the pump circuit comprises a plurality of series connected diodes.

7. The ESD protection circuit of claim 1 wherein the pump circuit is a diode triggered SCR.

8. The ESD protection circuit of claim 1 wherein the impedance circuit comprises a variable impedance element having a controllable impedance value.

9. The ESD protection circuit of claim 1 further comprising an isolation resistor coupled between an input terminal and the first terminal of the transistor.

10. The ESD protection circuit of claim 1 wherein the first terminal is a gate, the second terminal is a source and the third terminal is a drain.

11. The ESD protection circuit of claim 1 wherein the second terminal is a bulk of the transistor.

12. An electrostatic discharge (ESD) protection circuit for protecting a transistor circuit comprising a first transistor having at least a first terminal, a second terminal and a third terminal and a second transistor having at least a first terminal, a second terminal and a third terminal, where the third terminal of the first transistor is connected to the third terminal of the second transistor, and the first terminal of the first transistor is connected to the first terminal of the second transistor, comprising:
a first protection circuit, coupled from the first terminal of the first transistor to the second terminal of the first transistor, for limiting a voltage between the first terminal and the second terminal of the first transistor by adjusting the potential level of the second terminal of the first transistor in response to an ESD event being incident upon the first terminal of the first transistor, wherein the first protection circuit comprises a first pump circuit and a first impedance circuit, said first impedance circuit coupled from the second terminal of the first transistor to a first potential, where said first pump circuit applies an electrical signal to the first impedance circuit in response to the ESD event, said first terminal of the first transistor comprises a gate of the first transistor, said second terminal of the first transistor comprises at least one of a source or a drain of the first transistor;

a second protection circuit, coupled from the first terminal of the second transistor to the second terminal of the second transistor, for limiting a voltage between the first terminal and the second terminal of the second transistor by adjusting the potential level of the second terminal of the second transistor in response to an ESD event being incident upon the first terminal of the second transistor, wherein the second protection circuit comprises a second pump circuit and a second impedance circuit, said second impedance circuit coupled from the second terminal of the second transistor to a second potential, where said second pump circuit applies an electrical signal to the second impedance circuit in response to the ESD event;

said first terminal of the second transistor comprises a gate of the second transistor, said second terminal of the second transistor comprises at least one of a source or a drain of the second transistor.

13. The ESD circuit of claim 12 wherein the first and second transistors are at least one of NMOS or PMOS.

14. The ESD protection circuit of claim 12 further comprising:
a first primary protection circuit coupled from the first terminal of the first transistor to a first potential; and
a second primary protection circuit coupled from the first terminal of the second transistor to a second potential.

15. The ESD protection circuit of claim 12 wherein the first and second impedance circuits each comprise at least one of a resistance, a capacitance and an inductance.

16. The ESD protection circuit of claim 12 wherein the first and second impedance circuits each comprises a resistor connected in parallel with at least one of a capacitor and an inductor.

17. The ESD protection circuit of claim 12 wherein at least one of the first and second impedance circuits comprise an active device.

18. The ESD protection circuit of claim 12 wherein the first and second pump circuits each comprise a plurality of series connected diodes.

19. The ESD protection circuit of claim 12 wherein the first and second pump circuits comprise a diode triggered SCR.

20. The ESD protection circuit of claim 12 wherein the first and second impedance circuits each comprise a variable impedance element having a controllable impedance value.

21. The ESD protection circuit of claim 12 further comprising an isolation resistor coupled between an input terminal and the first terminal of the first and second transistors.

22. ESD protection circuit of claim 12 wherein the first terminal of both the first and second transistors is a gate, the second terminal of both the first and second transistors is a source and the third terminal of both the first and second transistors is a drain.

23. A method of protecting a circuit from an ESD event comprising:
applying a voltage to a first terminal of the transistor, wherein said voltage is external to the circuit;
activating a pump in response to the ESD event that is incident upon the first terminal of the transistor and
applying an electrical signal from the pump to an impedance to increase a potential level on a second terminal of a transistor.

24. The method of claim 23 wherein the first terminal is a gate of the transistor and the second terminal is at least one of a source or bulk of the transistor.

* * * * *